United States Patent [19]

Kawachi et al.

[11] Patent Number: 5,096,522
[45] Date of Patent: Mar. 17, 1992

[54] PROCESS FOR PRODUCING COPPER-CLAD LAMINATE

[75] Inventors: Norio Kawachi; Katsurou Aoshima; Tatsuo Wada, all of Kanagawa; Toshiro Miki, Tokyo; Takeharu Kato, Aichi, all of Japan

[73] Assignees: Meiko Electronics Co., Ltd., Kanagawa; Toagosei Chemical Industry, Tokyo, both of Japan

[21] Appl. No.: 542,360

[22] Filed: Jun. 22, 1990

[30] Foreign Application Priority Data

Jun. 23, 1989 [JP] Japan .................. 1-159761
Jun. 23, 1989 [JP] Japan .................. 1-159762

[51] Int. Cl.$^5$ .................. B32B 31/00; C23F 1/02; B44C 1/22
[52] U.S. Cl. .................. 156/151; 156/233; 156/249; 156/631; 156/902; 205/76; 205/187
[58] Field of Search .................. 156/150, 151, 230, 233, 156/235, 238, 247, 241, 249, 631, 666, 902; 204/23, 32.1, 34, 40, 44, 52.1

[56] References Cited

U.S. PATENT DOCUMENTS

| | | | |
|---|---|---|---|
| 2,984,595 | 5/1961 | Schumpelt et al. | 156/151 |
| 3,099,608 | 7/1963 | Radovsky et al. | 204/15 |
| 3,152,938 | 10/1964 | Osifchin et al. | 156/902 X |
| 4,715,116 | 12/1987 | Thorpe et al. | 29/846 |
| 4,790,902 | 12/1988 | Wada et al. | 156/630 |

FOREIGN PATENT DOCUMENTS 0258452 3/1988 European Pat. Off.

Primary Examiner—William A. Powell
Attorney, Agent, or Firm—Sughrue, Mion, Zinn Macpeak & Seas

[57] ABSTRACT

A process for producing a copper-clad laminate is disclosed which includes the steps of (a) contacting the surface of a conductive carrier with a catalyst liquid containing at least one noble metal selected from the group consisting of Pd, Pt, Ru, Au, and Ag; (b) subsequently forming a copper foil layer on the treated surface of the conductive carrier by copper electroplating; (c) laminating an insulating base on the copper foil layer by hot-press bonding; and (d) separating the conductive carrier from the resulting laminate. The copper foil layer in the resulting copper-clad laminate has reduced pinholes and exhibits isotropic mechanical characteristics.

19 Claims, No Drawings

PROCESS FOR PRODUCING COPPER-CLAD LAMINATE

FIELD OF THE INVENTION

This invention relates to a process for producing a copper-clad laminate and, more particularly to a process for producing a copper-clad laminate having a copper foil layer with reduced pinholes and exhibiting isotropic mechanical characteristics.

BACKGROUND OF THE INVENTION

A copper-clad laminate used as a base for printed circuit boards incorporated into various electronic devices is produced by hot-press bonding a copper foil having a sufficient thickness for a conductive circuit to an insulating carrier comprising, for example, a glass fiber/epoxy resin composite material.

One conventional process for producing a copper-clad laminate comprises electrodepositing copper on a rotating drum acting as a cathode, the surface of which has been polished to form an electrolytic copper foil of a prescribed thickness, continuously peeling the copper foil off the drum, after which the matte surface of the copper foil is hot-press bonded on an insulating carrier.

In recent years, a transfer process has been widely used, which comprises forming a copper deposit of a prescribed thickness on a conductive carrier having a smooth surface, e.g., a single plate of stainless steel, by electroplating, bringing the copper-plated side of the conductive carrier into contact with an insulating base, followed by hot-press bonding, and stripping the conductive carrier to transfer the copper deposit onto the surface of the insulating base.

In the above-described transfer process, copper is electrodeposited by, for example, electroplating, on the surface of a conductive carrier, such as a conductive metallic belt or single plate, to form a copper foil layer having a prescribed thickness. Then, a thin sheet of a prepreg is hot-press bonded to the surface of the copper foil layer to obtain an integral laminate, and the conductive carrier is peeled off from the laminate while transferring the copper foil layer to the prepreg. There is thus obtained a copper-clad laminate having a transferred copper foil layer.

With the recent demand for higher performance of printed circuit boards, high density mounting of various elements has been demanded. High-density printed circuit boards capable of forming a minute circuit pattern have also been studied.

To obtain such a high-density printed circuit board, it is advantageous to use an ultrathin copper-clad laminate having an extremely thin copper foil layer.

In general, a copper foil layer having pinholes has a poor appearance and a reduced commercial value. Various efforts have been made to avoid forming pinholes in the production of such an ultrathin copper-clad laminate by the transfer process.

While causes of pinholes in the transfer process are not always clear, it is considered that the surface condition of the conductive carrier used and the conditions of electroplating including plating bath composition, have great influence on pinhole formation.

Conductive carriers which can be used in the transfer process are generally prepared by rolling an ingot of stainless steel, nickel, or copper into a plate or a sheet. The surface of the resulting roller plate or sheet unavoidably contains metallurgical defects, such as pores produced during working (e.g., oil pits), non-metallic impurities or intermetallic compounds produced during melting. Since copper has a duplicating precision of about 0.05 μm, if a copper foil layer is formed on such a conductive carrier, the surface defects are duplicated on the formed copper foil layer. When, in particular, there are undercut pits on the conductive carrier surface, build-up of copper is concentrated on the peripheral portion of the pits. When an insulating base is laminated on the thus-formed copper foil layer and then separated from the conductive carrier, the electrodeposited copper built up on a part of the undercut pits is torn off and remains on the carrier. As a result, the copper foil layer of the resulting copper-clad laminate has pinholes corresponding to the undercut pits.

Further, if a conductive carrier having a non-metallic impurity or an intermetallic compound exposed on the surface thereof is used, this produces a difference or a scatter in electrical conductivity on the surface of such a conductive carrier due to the difference in conductivity between the non-metallic impurity or intermetallic compound and the matrix metal. As a result, the degree of copper electrodeposition on the carrier varies according to site, and the resulting copper foil layer has pinholes.

Where the defects of the conductive carrier are physical, such as the above-described pores, it is possible to eliminate such defects by polishing the surface of the carrier. However, where a defect is a non-metallic impurity or an intermetallic compound contained in the carrier per se, it cannot be removed by surface polishing.

On the other hand, considering the pinhole problem from the aspect of electroplating conditions, it is known that when copper plating is conducted by using a plating bath comprising copper pyrophosphate or copper cyanide at a low current density, deposition of copper can be controlled by the action of a chelating agent added to the bath, and pinholes tend to be reduced. Nevertheless, such a method of copper electroplating achieves only a low rate of copper deposition and low productivity.

Thus, a copper foil layer formed by the conventional transfer processes typically exhibits a number of pinholes due to metallurgical defects on the surface of a conductive carrier used. Therefore, productivity and the non-defective yield of these processes are unavoidably reduced when applied to the production of ultrathin copper-clad laminates useful as a basic material of high-density printed circuit boards.

Further, a conductive carrier develops anisotropy on its surface during the preparation, i.e., rolling and surface treatment prior to copper foil formation, e.g., polishing. As a result, the copper foil layer formed on the anisotropic carrier surface also shows anisotropy in its mechanical characteristics, for example, a difference of elongation in crossing directions. Such anisotropy of a copper foil layer adversely affects the reliability of circuits through repetition of steps accompanied by heating for formation of a printed circuit board.

In the above-described transfer process, a copper foil layer, such as an electrolytic copper foil and a copper deposit, is usually subjected to the following surface treatments.

One is a surface roughening treatment for increasing adhesion strength to an insulating base onto which the copper foil layer is transferred. Such a treatment conventionally includes surface roughening by mechanical grinding or chemical grinding using an etching solution. Recently, a surface roughening method comprising precipitating ramiform projections on the surface of a copper layer surface by electrolytic copper plating to make the surface uneven is widely employed. On hot-press bonding to an insulating base, the ramiform projections are buried in the matrix resin of the insulating base to exert an anchoring effect, thus improving adhesion strength to the insulating base.

Another treatment, which follows the above-described surface roughening treatment, comprises forming a heat deterioration preventive layer on the roughened surface.

A copper foil layer of a copper-clad laminate is generally etched through a prescribed mask to form a conductive circuit corresponding to the mask pattern. Various IC chips are mounted on the conductive circuit by soldering. Therefore, the conductive circuit or adhesion areas between the circuit and the base at the soldered joints are partly heated at the time of soldering. As a result, the copper of the roughened surface undergoes heat deterioration and peels from the surface of the insulating base.

In this connection, a circuit board to be used in automobiles is required not to undergo heat deterioration in a heating tests of 180° C. for 48 hours. Taking tests such as specification test into consideration, this requirement, though severe, is a reasonable heat deterioration property.

A heat deterioration preventive layer is a layer for preventing the above-mentioned heat deterioration and to assure adhesion between a copper foil layer and an insulating base, which usually comprises brass (Cu-Zn), an Ni-Cu alloy, an Sn-Cu alloy, or an Sn-Zn-Cu alloy.

The heat deterioration preventive layer is usually formed by electroplating a prescribed metal or alloy on the roughened surface of a copper foil layer or bonding a heat deterioration preventive layer on the roughened surface of a copper foil layer by using an adhesive.

Still another surface treatment is a rust preventive treatment. The purpose of this treatment is to prevent oxidative discoloration of the outside surface of a copper foil layer (i.e., the side opposite to an insulating base) during preservation and/or transportation thereby preventing a reduction in commercial value from the standpoint of appearance. The rust preventive treatment is generally conducted with a chromate. A treatment on only the outer side of a copper foil layer suffices for this purpose.

Thus, a copper-clad laminate composed of an insulating base having press-bonded thereon a copper foil layer has a structure such that the side of the copper foil layer in contact with the base has a roughened surface, and the roughened surface of the copper foil is coated with a heat deterioration preventive layer and, if desired, a rust preventive layer is further formed on the heat deterioration preventive layer.

A projection layer consisting of the roughened surface and the heat deterioration preventive layer formed thereon is generally called a profile layer. The profile layer has been a section formed by a serial combination of independent two steps of surface roughening of a copper foil layer and formation of a heat deterioration preventive layer.

In the profile layer, where the projections of the roughened surface are too high, that is, where the surface roughness of the copper foil layer is too large, the matrix resin of an insulating base press-bonded thereto does not reach the valleys of the projections, thus easily entrapping air bubbles, which causes insufficient adhesion between the copper foil layer and the base. The height of projections of the profile layer, i.e., surface roughness of the copper foil layer is usually from about 7 to 9 μm, and the above-described unfavorable phenomenon often reduces the reliability of copper-clad laminates.

When a copper foil layer of a copper-clad laminate is subjected to a prescribed etching treatment, in cases where the projection height of the profile layer varies with place, that is, where the surface roughness of a copper foil layer is widely scattered, projections having a small height and being buried shallow in the matrix resin of an insulating base can be removed by etching, while projecting points of high projections are not etched and remain in the matrix resin. The non-etched residual copper (called stain) impairs electrical insulation between conductive circuit lines. Such a phenomenon is a serious problem, particularly in the formation of a fine circuit pattern having small distances between copper wires, sometimes impairing the function as a printed circuit board.

A countermeasure which has been taken to cope with the above-described stain problem is to reduce the total thickness of a copper foil layer. However, the conventional copper foil layer has the thickness of the main par (base copper) reduced, with the projection height in the profile layer or the scatter thereof being substantially unchanged. Therefore, formation of a fine pattern is still accompanied by the problem of copper remaining after etching.

As discussed above, there has not yet been developed a copper foil layer for copper-clad laminates, which has a profile layer having low projections, that is, small surface roughness, irrespective of the thickness of the base part of the copper foil, and a small scatter in surface roughness.

SUMMARY OF THE INVENTION

An object of this invention is to provide a process for producing a copper-clad laminate having a pinhole-free and mechanically isotropic copper foil layer irrespective of conditions of copper electroplating.

It has now been found that this and other object of this invention are attained by a process for producing a copper-clad laminate including the steps of (a) contacting the surface of a conductive carrier with a catalyst liquid containing at least one noble metal selected from the group consisting of Pd, Pt, Ru, Rh, Au, and Ag; (b) subsequently forming a copper foil layer on the surface of the conductive carrier by copper electroplating; (c) laminating an insulating base on the copper foil layer by hot-press bonding; and (d) separating the conductive carrier from the copper foil layer to provide a copper-clad laminates.

DETAILED DESCRIPTION OF THE INVENTION

Step (a) comprises treating the surface of a conductive carrier with a catalyst liquid hereinafter described to make fine particles of Pd, Pt, Ru, Rh, Au, or Ag be uniformly adsorbed thereon.

The conductive carrier which can be used is not particularly limited and may be of any material and shape which have conventionally been used in transfer processes. Examples of suitable carriers are conventional belts or single plates made of stainless steel, nickel, or copper.

The catalyst liquid which can be used for the surface treatment of a conductive carrier is a liquid containing at least one noble metal selected from the group consisting of Pd, Pt, Ru, Rh, Au, and Ag, which has been conventionally employed where a non-conductive material, such as a synthetic resin, is electrolessly plated. Included in such a catalyst liquid are a colloidal type, a solution type, and a salt-added type, and any of these is suitable in the present invention. A colloidal type is particularly preferred in view of ease on handling. A preferred noble metal contained in the catalyst liquid is palladium because of its relative cheapness and availability.

For example, a colloidal Pd-Sn catalyst liquid comprises $PdCl_2$, $SnCl_2$, and a large quantity of hydrochloric acid, in which metallic palladium formed by the reducing activity of $Sn^{2+}$ is dispersed in a protective colloid of $\alpha$-stannic acid.

When the surface of a conductive carrier is treated with, for example, a catalyst liquid of the colloidal type, the above-described noble metal colloidal particles are uniformly adsorbed onto the surface of the carrier. As a result, non-metallic impurities or intermetallic compounds which are exposed on the surface of the conductive carrier are covered with these colloidal particles. On removal of the protective colloid surrounding the noble metal particles by, for example, washing with hydrochloric acid or water, there is obtained a conductive carrier, the entire surface of which is covered with fine noble metal particles. Thus, variation of conductivity on the surface of the conductive carrier can be eliminated, and the resulting carrier exhibits uniform conductivity owing to the adsorbed noble metal fine particles.

In step (b) (copper electroplating) subsequent to step (a), the adsorbed noble metal particles serve as nuclei for growth of electrodeposited copper crystals. Since the noble metal particles are extremely fine, the electrodeposited copper does not grow to large crystals. In other words, since the copper foil layer is formed on the conductive carrier as an aggregate of fine crystals, pinhole formation is effectively suppressed.

The catalyst liquid used in step (a) preferably has a noble metal concentration of from 100 to 150 ppm. At a noble metal concentration below the lower limit, the above-described effect on pinhole prevention is insufficient, resulting in an increase in the number and size of pinholes. Noble metal concentrations exceeding the upper limit produce no further improvement and are therefore economically disadvantageous.

In carrying out step (a), a conductive carrier is preferably previously subjected to a conventional cleaning treatment, such as degreasing and washing with water, and the cleaned surface is then treated with the above-described catalyst liquid. The treating method is not particularly restricted, but a method of immersing the carrier in the catalyst liquid is suitable. A suitable immersion time is from about 30 to 60 seconds. If the immersion time is too short, surface modification is insufficient, failing to inhibit pinhole formation in the formed copper foil layer. Too long an immersion time produces no further effect.

After the treatment with a catalyst liquid, the whole carrier is washed with water and forwarded to step (b).

It is more effective for inhibition of pinhole formation if the surface of the conductive carrier is polished prior to the treatment with a catalyst liquid. With an increase of surface roughness of the conductive carrier, the hydrogen overvoltage at the time of copper electroplating decreases to accelerate hydrogen evolution and, as a result, the copper foil layer formed easily develops pinholes. Such a phenomenon is believed to be suppressed by the above-described polishing treatment. Also, polishing of the conductive carrier not only removes irregular unevenness of the surface but makes the surface fresh, which appears to contribute to prevent pinhole formation. A preferred surface roughness of the conductive carrier ranges from about 0.1 to 1 $\mu$m.

Step (b) comprises plating the thus treated conductive carrier with electrolytic copper to form a copper foil layer having a prescribed thickness, i.e., a base copper layer.

The copper electroplating step is not particularly limited in conditions, such as composition, temperature or pH of a plating bath, current density, and plating time. Suitable conditions are appropriately selected in relation to a desired copper foil layer.

Either of a high-speed plating method (build-up speed: 15 $\mu$m/min or more) and a relatively slow plating method is effective to inhibit pinhole formation in the formed copper foil layer. So, an extremely high efficiency copper foil layer formation is achieved by adopting the high-speed plating method.

In order to enhance adhesion between the copper foil layer and the insulating base, it is preferred that the surface of the copper foil layer formed in step (b) is further plated with copper under different plating conditions to form a profile layer as described above on the base copper layer so that the surface to be adhered with an insulating base has a surface roughness of at most about 7 $\mu$m. In other words, the projection height of the profile layer is preferably at most about 7 $\mu$m, and more preferably from 1 to 5 $\mu$m. It is also preferable that the variation in the surface roughness of the profile layer is within about ±0.5 $\mu$m of the average surface roughness. That is, the thickness a of the profile layer (i.e., height of projections) preferably satisfies the following relationship:

$$a_0 - 0.5 \leq a \leq a_0 + 0.5$$

wherein $a_0$ is the average projection height (average surface roughness) of the profile layer; and a is the thickness (projection height) of the profile layer.

If the surface roughness exceeds 7 $\mu$m, air bubbles are liable to be entrapped in the profile layer on hot-press bonding with an insulating base, which causes insufficient adhesion between the copper foil layer and the insulating base. If the surface roughness is widely scattered over about ±0.5 $\mu$m, after etching treatment for circuit formation undesired copper often remains, resulting in great deterioration of electrical insulating properties.

A profile layer which is formed in the optional step following step (b) by electroplating under the specific conditions described below, not only provides a rough surface but, at the same time, functions as a heat deterioration preventive layer. The degree of roughness of the profile layer can be selected as desired by appropriately controlling the conditions of electroplating, inter alia, plating time.

The profile-forming step is explained in detail below.

The profile layer can be formed by electroplating, and particularly high-speed plating. That is, the surface of the electrodeposited copper layer on the conductive carrier on the side to be adhered with an insulating base is subjected to high-speed plating to form a profile layer.

In more detail, the electrolytic copper deposit, i.e., the base copper layer, formed on the conductive carrier is used as a cathode and arranged to face to an insoluble anode e.g., of Ti, Pb, or Pt-treated Ti, at a prescribed gap therebetween, and a copper plating bath for formation of a profile layer is contacted with both electrodes. Thus, electrolytic copper is precipitated and deposited on the base copper surface to provide a layer with not only roughness but resistance to heat deterioration.

The planar gap between the anode and cathode (the base copper layer) is appropriately selected depending on the contact speed of the plating bath, preferably ranging from about 10 to 15 mm.

The copper bath for formation of a profile layer is preferably an acidic bath containing, for example, sulfuric acid and containing a chelating agent and more preferably further containing at least one metal selected form the group consisting of Zn, Sn, and Co. One example of preferred copper electroplating baths for the above purpose comprises about 110 to 130 g/l of copper sulfate pentahydrate ($CuSO_4.5H_2O$), about 55 to 65 g/l of sulfuric acid ($H_2SO_4$), about 21 to 24 g/l of a nitrate ion ($NO_3^-$), about 200 to 1000 ppm of at least one compound selected from the group consisting of a zinc compound, a tin compound, and a cobalt compound, and about 5 to 20 g/l of a chelating agent.

Copper sulfate pentahydrate serves as a copper source and is present in the plating bath in concentrations of from about 110 to 130 g/l. In concentrations less than about 110 g/l, copper supply to the base copper surface is insufficient, making it difficult to form a uniform and scatter-free profile layer on the entire surface of the base copper layer. If the concentration is higher than about 130 g/l, the degree of surface roughness becomes too high, making it difficult to obtain uniform roughness. A preferred concentration of copper sulfate pentahydrate is from about 115 to 120 g/l.

Sulfuric acid serves to increase ionic conductivity of the plating bath, whose concentration is set within a range of from about 55 to 65 g/l. If the concentration is less than about 55 g/l, overvoltage becomes too high to conduct sufficient surface roughening. If it exceeds about 65 g/l, conductivity excessively increases, failing to achieve surface roughening. A preferred concentration of sulfuric acid is from about 55 to 60 g/l.

Nitrate ions ($NO_3^-$) undergo anodizing to form a by-product and eventually unevenly precipitate Cu on the base copper surface to contribute to surface roughening. The concentration of nitrate ion ranges from about 21 to 24 g/l. If it is less than about 21 g/l, the degree of roughness becomes high with an increased scatter. The degree of roughness also becomes high in concentrations exceeding about 24 g/l. Sources of a nitrate ion include nitric acid and nitrates, e.g., $KNO_3$ and $NaNO_3$.

The zinc, tin or cobalt compound serves as a source of Zn, Sn, or Co, respectively. This is a component for improving the heat deterioration preventive effects of a profile layer in co-operation with a chelating agent hereinafter described. The concentration of these compounds ranges from about 200 to 1000 ppm, and preferably from about 250 to 500 ppm. Concentrations less than about 200 ppm tend to bring about reduction in heat deterioration preventive effect of a profile layer. Those higher than about 1000 ppm tend to reduce the mechanical strength of a profile layer, causing separation of a profile layer during handling.

Any zinc compound can be used as long as it is soluble in the plating bath. Examples of suitable zinc compounds are ZnO and $ZnSO_4$. Examples of suitable tin compounds are $SnCl_2$, SnO, and $SnSO_4$. Examples of suitable cobalt compounds are $Co(NO_3)_2$, $CoCl_2$, and $CoSO_4$.

The chelating agent is used in a concentration of from about 5 to 20 g/l. Concentrations less than about 5 g/l fail to form a uniform heat deterioration preventive layer, showing no improvement in heat deterioration preventive effect. The upper limit is set at about 20 g/l from the standpoint of solubility in the bath. A preferred concentration of the chelating agent is from about 5 to 10 g/l.

Examples of suitable chelating agents include ethylenediaminetetraacetic acid (EDTA), tartaric acid, ethylenediamine, and pyrophosphoric acid, with EDTA being particularly preferred in view of the heat deterioration preventive effects obtained.

The plating bath having the above-mentioned composition is acidic, having a pH between 1 and 2. On electroplating, the plating bath is preferably used in a turbulent flow by adjusting the Reynolds' number (Re) to exceed 2300. The flow becomes a laminar flow at an Re of 2300 or smaller.

The plating bath for formation of a profile layer is provided at a high flow rate (turbulent form) in contact with anode and cathode surfaces. The flow rate at the contacting interface with the cathode or anode (contact speed) is controlled to a range of from about 0.3 to 0.7 m/sec. If it is less than about 0.3 m/sec, Cu ion supply to the cathode surface is retarded to cause a wide scatter of projection height in the formed profile layer, to produce a non-uniform profile layer. On the other hand, if the contact flow rate is higher than about 0.7 m/sec, the degree of surface roughness of the formed profile layer is insufficient. A preferred contact flow rate of a plating bath ranges from about 0.35 to 0.45 m/sec.

The electrical current density is controlled to a range of from about 30 to 55 $A/dm^2$. If it is less than about 30 $A/dm^2$, copper cannot be uniformly built up, and the projection height of the resulting profile layer is widely scattered. If it exceeds about 55 $A/dm^2$, copper is excessively built up to make projections too high.

The above plating bath is preferably kept at a temperature of from about 20° to 22° C. during electroplating. At a bath temperature lower than about 20° C., mobility of Cu ion is decreased so that chemical polarization easily takes place on the cathode surface, i.e., the base copper surface, and the rate of profile layer formation is reduced as a result. At a bath temperature exceeding about 22° C., surface roughening does not proceed unless the current density is increased.

A profile layer having projections of any desired height can be formed on the base copper layer by properly selecting these electroplating conditions, particularly plating time.

The above-described plating treatment may be carried out in one stage or, if desired, in two serial stages within the above-recited plating conditions.

Step (c) comprises superposing an insulating base on the copper foil layer formed in step (b) or on the profile layer, and the whole structure is hot-press bonded to produce an integral laminate Any insulating bases conventionally employed in transfer processes may be used without particular limitation. Prepregs prepared by impregnating an epoxy resin, into glass fibers and semi-curing the resin to the B-stage are usually suitable. Also, conditions for hot-press bonding are not particularly limited and may be easily determined according to the conventional transfer process.

Step (d) comprises separating the conductive carrie from the laminate obtained in step (c). In step (d), the copper foil layer is transferred to the insulating base to provide the copper-clad laminate of the present invention.

The present invention is now illustrated in greater detail with reference to the following Example and Comparative Examples, but the present invention is not to be construed as being limited thereto. Unless otherwise indicaed, all parts, percents and ratios are by weight.

EXAMPLES 1 TO 4 AND COMPARATIVE

Current density: 80 A/dm$^2$
Plating Time: 15 sec

The copper foil layer thus formed was brought into contact with a 50 $\mu$m thick glass/epoxy resin prepreg and hot-press bonded at 170° C. and 25 kg/cm$^2$ for 1 hour, followed by cooling to 30° C. over a period of 30 minutes, and the steel sheet was then peeled off. The sheet could be separated smoothly to give a ultrathin copper-clad laminate.

The resulting ultrathin copper-clad laminate was placed on a lighted table in a dark room, and the copper foil layer thereof was observed under a microscope (100 × magnification) to measure the number and size of pinholes existing in an area of 510 mm × 340 mm.

Further, the copper foil layer was cautiously peeled off the insulating base, and elongation (%) of the copper foil in the lengthwise direction (LD) and width direction (WD) was measured to obtain an LD/WD ratio of elongation.

The results of these evaluations are shown in Table 1.

TABLE 1

| Example No. | Treatment of Conductive Carrier | | | | Pinholes of Copper Foil Layer | | Elongation | | |
|---|---|---|---|---|---|---|---|---|---|
| | Surface Polishing*1 | | Treatment with Catalyst Liquid*2 | | Number | Size ($\mu$m) | LD (%) | WD (%) | LD/WD Ratio |
| Example | | | | | | | | | |
| 1 | done | (0.8) | done | (60) | 54 | 10–20 | 16.7 | 16.3 | 0.98 |
| 2 | done | (0.7) | done | (30) | 42 | 10–20 | 16.2 | 15.9 | 0.98 |
| 3 | done | (0.5) | done | (10) | ca. 600 | 50–100 | 15.7 | 14.1 | 0.90 |
| 4 | none | (2.0) | done | (60) | 69 | 50–100 | 15.2 | 14.9 | 0.98 |
| Comparative Example | | | | | | | | | |
| 1 | done | (0.5) | none | (0) | ca. 16,000 | 100 or more | 16.5 | 13.2 | 0.80 |
| 2 | none | (2.0) | none | (0) | ca. 160,000 | 100 or more | 14.8 | 12.6 | 0.85 |

*1: Surface roughness ($\mu$m) is indicated in the parentheses.
*2: Immersion time (sec) is indicated in the parentheses.

EXAMPLES 1 AND 2

Six stainless steel (SUS 304) sheets of 510 mm in length, 340 mm in width, and 1 mm in thickness having a surface roughness of from 1 to 2.0 $\mu$m and having been subjected to a hardening treatment were prepared. These steel plates were longitudinally rolled sheets.

One side of each of 4 sheets was polished so as to have a surface roughness of from 0.5 to 0.8 $\mu$m by means of an oscillating rotary polishing machine.

Each of the 6 steel sheets was degreased, washed with an acid, and then washed with water to clean the surface. Three of the 4 steel sheets subjected to the polishing treatment and 1 of the 2 sheets not having been subjected to the polishing treatment were immersed in a catalyst liquid comprising a Pd-Sn-based activator of colloid type (Pd concentration: 130 ppm) for a period shown in Table 1 below. Each sheet was taken out from the catalyst liquid and thoroughly washed with water.

High-speed plating was conducted on each of the 6 steel sheets under the following conditions to form a copper foil layer having a thickness of 5 $\mu$m.

Plating bath: 150 g/l of CuSO$_4$.5H$_2$O
200 g/l of H$_2$SO$_4$
Bath temperature: 60° C.
Anode: Pt-Zn
Contact flow rate of plating bath with steel sheet: 7 m/sec As is apparent from the results in Table 1, even with the surface roughness being equal (Example 3 and Comparative Example 1), the treatment with a catalyst liquid markedly reduces pinholes in number. On comparing Example 1 with Example 4, it can also be seen that where a treatment with a catalyst liquid is conducted, the smaller surface roughness obviously reduces the size of pinholes.

In addition, the copper foil layer formed by the process of the present invention proves isotropy in mechanical characteristics. This is considered to be because fine noble metal particles are adsorbed on the surface of the conductive carrier having anisotropy due to lengthwise rolling to become nuclei on which copper is densely precipitated and built up. That is, the fine noble metal particles participate in the initial precipitation mechanism, an important part of crystal growth, thereby influenceing the isotropy of physical properties.

REFERENCE EXAMPLES 1 TO 7 AND COMPARATIVE EXAMPLES 3 TO 15

1) Formation of Base Copper Layer

One side of a stainless steel sheet (SUS 630) was polished so as to have a surface roughness of 0.8 $\mu$m by means of an oscillating rotary buff, and copper was built up on the polished surface to 5 $\mu$m by using a plating bath containing 150 g/l of a CuSO$_4$.5H$_2$O and 200 g/l of H$_2$SO$_4$.

2) Formation of Profile Layer

Then, electroplating was carried out using the Cu-plated steel plate as a cathode and a Ti plate as an anode at an electrode gap of 14 to 15 mm under conditions shown in Table 2. In Table 2, plating conditions of Reference Example 3 and Comparative Examples 13 to 15 indicate that the plating was conducted in two stages. For example, in Reference Example 3, the first-stage plating was performed at a bath contact flow rate of 0.7 m/sec and at a current density of 53 A/dm$^2$ for 15 seconds, and then the second-stage plating was performed at a bath contact flow rate of 0.3 m/sec and at a current density of 30 A/dm$^2$ for 6 seconds. The both compositions used in the formation of profile layer are also shown in Table 2.

An average value and the variation of projection height (μm) of the formed profile layer were measured under a scanning electron microscope. The results obtained are shown in Table 3.

3) Performance of Profile Layer

The thus obtained copper foil layer was brought into contact with a 0.1 mm thick prepreg of glass epoxy (ANSI grade: FR-4), and the whole structure was hot-press bonded at 170° C. and a press pressure of 25 kg/cm$^2$. The steel sheet was then peeled off to obtain a copper-clad laminate.

Adhesion strength between the copper foil layer and the prepreg, copper remaining after etching, and heat deterioration resistance of the resulting copper-clad laminate were evaluated according to the following test methods.

1) Adhesion Strength

The copper-clad laminate was cut to prepare a 10 mm wide specimen for peel testing. One end of the specimen was peeled off to an appropriate length, fixed to a grip, and pulled at a rate of 50 mm/min at a peel angle of 90° to measure peel strength (kg/cm). The higher the value, the higher the adhesion.

2) Copper Remaining After Etching

A 100 μm wide line pattern having a line gap of 200 μm was formed on the copper-clad laminate according to a known etching treatment to obtain a printed circuit board. A direct current voltage of 500 V was applied to the circuit, and sparking and reduction or instability of electrical resistance were observed. Evaluation was made based on the following rating system:

| | |
|---|---|
| Good | The resistance was 10$^4$ MΩ or more with no instability. |
| Poor | Sparking was observed, or the resistance was less than 10$^4$ MΩ with instability. |

3) Heat Deterioration Resistance

The copper-clad laminate was allowed to stand in an oven at 180° C. for 48 hours, and the peel strength was measured in the same manner as described above. The higher the value, the higher the heat deterioration resistance.

The results of these evaluations are shown in Table 3.

TABLE 2

| Example No. | Composition of Plating Bath | | | | | | | Plating Condition | | |
|---|---|---|---|---|---|---|---|---|---|---|
| | CuSO$_4$·5H$_2$O (g/l) | H$_2$SO$_4$ (g/l) | NO$_3$$^-$ (g/l) | ZnO (ppm) | SnCl (ppm) | Co(NO$_3$)$_2$ (ppm) | EDTA (g/l) | Contact Flow Rate of Plating Bath (m/sec) | Currect Density (A/dm$^2$) | Plating Time (sec) |
| Reference Example 1 | 120 | 55 | 22 | 300 | — | — | 7 | 0.5 | 45 | 20 |
| Example | | | | | | | | | | |
| 2 | 115 | 60 | 21 | 300 | — | — | 10 | 0.3 | 30 | 25 |
| 3 | 115 | 60 | 21 | 250 | — | — | 6 | 0.7/0.3 | 53/30 | 15/6 |
| 4 | 115 | 60 | 21 | — | 350 | — | 5 | 0.5 | 50 | 25 |
| 5 | 115 | 60 | 21 | — | — | 470 | 5 | 0.5 | 50 | 25 |
| 6 | 120 | 60 | 23 | — | — | — | 10 | 0.4 | 35 | 24 |
| 7 | 115 | 60 | 22 | — | — | — | 15 | 0.5 | 50 | 20 |
| Comparative Example | | | | | | | | | | |
| 3 | 121 | 55 | 22 | — | — | — | — | 0.5 | 45 | 20 |
| 4 | 115 | 60 | 22 | 500 | — | — | — | 0.4 | 50 | 23 |
| 5 | 120 | 55 | 21 | 150 | — | — | — | 0.5 | 45 | 20 |
| 6 | 120 | 55 | 21 | 700 | — | — | — | 0.5 | 45 | 20 |
| 7 | 118 | 60 | 29 | — | — | — | — | 0.4 | 50 | 23 |
| 8 | 115 | 60 | 12 | — | — | — | — | 0.5 | 45 | 20 |
| 9 | 120 | 60 | 24 | — | — | — | — | 1.0 | 50 | 25 |
| 10 | 115 | 60 | 21 | — | — | — | — | 0.04 | 30 | 25 |
| 11 | 121 | 55 | 21 | — | — | — | — | 0.5 | 70 | 15 |
| 12 | 120 | 57 | 23 | — | — | — | — | 0.8 | 85 | 10 |
| 13 | 115 | 60 | 24 | — | — | — | — | 0.5/0.3 | 65/35 | 12/6 |
| 14 | 110 | 63 | 20 | — | — | — | — | 0.6/0.6 | 45/45 | 15/5 |
| 15 | 115 | 65 | 21 | — | — | — | — | 0.5/0.3 | 50/40 | 20/4 |

TABLE 3

| Example No. | Properties of Profile Layer | | | Peel Strength (kg/cm) | Copper Remaining After Etching | Peel Strength After Hert Treatment (kg/cm) | Total Judgement |
|---|---|---|---|---|---|---|---|
| | Average Projection Height (μm) | Scatter of Projection Height (μm) | Uniformity* | | | | |
| Reference | | | | | | | |

TABLE 3-continued

| | Properties of Profile Layer | | | | | Peel | |
|---|---|---|---|---|---|---|---|
| Example No. | Average Projection Height (μm) | Scatter of Projection Height (μm) | Uniformity* | Peel Strength (kg/cm) | Copper Remaining After Etching | Strength After Hert Treatment (kg/cm) | Total Judgement |
| Example | | | | | | | |
| 1 | 2.25 | ±0.25 | Excellent | 1.53 | Good | 1.02 | Excellent |
| 2 | 1.95 | ±0.25 | Excellent | 1.49 | Good | 0.95 | Excellent |
| 3 | 2.65 | ±0.1 | Excellent | 1.56 | Good | 0.95 | Excellent |
| 4 | 2.80 | ±0.25 | Excellent | 1.89 | Good | 0.95 | Excellent |
| 5 | 2.20 | ±0.2 | Excellent | 1.78 | Good | 0.90 | Excellent |
| 6 | 1.85 | ±0.35 | Excellent | 1.53 | Good | 0.55 | Good |
| 7 | 2.10 | ±0.2 | Excellent | 1.59 | Good | 0.82 | Good |
| Comparative Example | | | | | | | |
| 3 | 2.5 | ±0.25 | Excellent | 1.51 | Good | 0.48 | Poor |
| 4 | 3.75 | ±1.25 | Excellent | 1.60 | Good | 0.60 | Good |
| 5 | 2.25 | ±0.25 | Excellent | 1.53 | Good | 0.48 | Poor |
| 6 | 2.25 | ±0.25 | Excellent | 1.53 | Good | 0.60 | Good |
| 7 | 3.75 | ±1.25 | Poor | 1.71 | Good | — | Poor |
| 8 | 2.25 | ±0.75 | Poor | 1.25 | Good | — | Poor |
| 9 | 3.0 | ±1.5 | Poor | 1.68 | Good | — | Poor |
| 10 | 4.0 | ±2.0 | Poor | 1.30 | Poor | — | Poor |
| 11 | 4.75 | ±1.25 | Poor | 1.88 | Poor | — | Poor |
| 12 | 8.25 | ±0.75 | Poor | 1.45 | Poor | — | Poor |
| 13 | 2.25 | ±0.75 | Good | 1.42 | Good | — | Poor |
| 14 | 1.75 | ±0.75 | Good | 1.15 | Good | — | Poor |
| 15 | 2.25 | ±0.75 | Good | 1.39 | Good | — | Poor |

EXAMPLES 5 and 6

One side of two stainless steel sheets (SUS 630) was polished so as to have a surface roughness of 0.8 μm by means of an oscillating rotary buff. After immersing the steel sheets in a catalyst liquid comprising a Pd-Sn-based activator of colloid type (Pd concentration: 130 ppm) for 30 seconds and washing with water, copper was electrically plated on the polished surface of each of the steel sheets by the same copper plating as in Example 1, whereby a base copper layer having a thickness of 5 μm was formed.

Then, electroplating was carried out in the same manner as in Reference Example 1 to form a profile layer on the formed base copper layer, except that the electroplating conditions and the bath compositions were changed as shown in Table 4.

The thus-obtained copper foil layer was brought into contact with a prepreg and hot-press bonded, followed by peeling off the steel sheet to obtain a copper-clad laminate as in Reference Example 1.

Properties of the copper-clad laminates and the formed profile layers were measured in the same manner as in Reference Example 1 and Example 1, and the results are shown in Table 5 below.

TABLE 4

| | Composition of Plating Bath | | | | | | Plating Condition | |
|---|---|---|---|---|---|---|---|---|
| Example No. | CuSO$_4$·5H$_2$O (g/l) | H$_2$SO$_4$ (g/l) | NO$_3$ (g/l) | ZnO (ppm) | EDTA (g/l) | Contact Flow Rate of Plating Bath (m/sec) | Current Density (A/dm$^2$) | Plating Time (sec) |
| 5 | 120 | 60 | 23 | 300 | 8 | 0.5 | 50 | 20 |
| 6 | 120 | 60 | 22 | 250 | 5 | 0.7/0.3 | 55/30 | 15/5 |

TABLE 5

| | Properties of Profile Layer | | | | | Peel | Pinholes of Copper Foil Layer | |
|---|---|---|---|---|---|---|---|---|
| Example No. | Average Projection Height (μm) | Scatter of Projection Height (μm) | Uniformity | Peel Strength (kg/cm) | Copper Remaining After Etching | Strength After Hert Treatment (kg/cm) | Number | Size (μm) |
| 5 | 2.4 | ±0.25 | Excellent | 1.63 | Good | 1.08 | 48 | 10–20 |
| 6 | 2.20 | ±0.25 | Excellent | 1.60 | Good | 1.05 | 54 | 10–20 |

As described above, according to the process of the present invention, surface defects of a conductive carrier are eliminated by surface treatment with a liquid catalyst to cover the defects with fine noble metal particles, making it possible to form a uniform copper foil layer on the carrier surface while suppressing pinhole formation. Thus, the process of the present invention is very useful for the production not only of bases of high-density printed circuit boards, but also of ultrathin copper-clad laminates for other uses which have encountered the problem of pinhole formation.

Further, in the copper-clad laminate according to one preferred embodiment of the present invention, despite a small projection height of a profile layer, the copper foil layer exhibits high adhesion strength to an insulating base. The projections of the profile layer have a small distribution of height variation so that copper remaining after etching is reduced. The profile layer is excellent in heat deterioration preventive effect as well. These effects are attributed to the specific composition of plating bath and the specific plating conditions used in the formation of the profile layer.

The process for forming the above-described profile layer provides high productivity, because a high-speed plating technique is adopted and, above all, because use of a specific electrolytic copper plating bath makes it possible to carry out a surface roughening treatment and a heat deterioration preventive treatment in a single step, whereas these two treatments have conventionally been conducted separately. Therefore, the present invention is of great industrial value.

While the invention has been described in detail and with reference to specific embodiments thereof, it will be apparent to one skilled in the art that various changes and modifications can be made therein without departing from the spirit and scope thereof.

What is claimed is:

1. A process for producing a copper-clad laminate comprising the steps of:
   (a) contacting the surface of a conductive carrier with a catalyst liquid comprising at least one noble metal selected from the group consisting of Pd, Pt, Ru, Rh, Au and Ag;
   (b) subsequently forming a copper foil layer on the surface of the conductive carrier by copper electroplating;
   (c) laminating an insulating base on the copper foil layer by hot-press bonding; and
   (d) separating the conductive carrier from the copper foil layer to provide a copper-clad laminae.

2. The method as claimed in claim 1, wherein said catalyst liquid in step (a) comprises a colloidal catalyst liquid comprising a dispersion of metallic noble metal particles in a protective colloid.

3. The method as claimed in claim 1, wherein said catalyst liquid in step (a) comprises a colloidal Pd-Sn catalyst liquid.

4. The method as claimed in claim 2, wherein in step (a) said colloidal catalyst liquid uniformly deposits fine particles of said noble metal on said conductive carrier surface.

5. The method as claimed in claim 4, wherein after said step (a) and prior to said step (b) said conductive carrier surface contacted with said catalyst liquid is washed with hydrochloric acid or water.

6. The method as claimed in claim 1, wherein said catalyst liquid comprises said noble metal in a concentration of from 100 to 150 ppm.

7. The method as claimed in claim 1, wherein prior to said step (a) said conductive carrier surface is degreased and washed water.

8. The method as claimed in claim 6, wherein said conductive carrier surface is contacted with said catalyst liquid for a period of from about 30 to 60 seconds.

9. The method as claimed in claim 1, wherein said conductive carrier has a surface roughness of from about 0.1 to 1 $\mu$m.

10. The method as claimed in claim 1, wherein said copper foil layer is formed by a high-speed plating method providing a copper foil layer build-up of at least about 15 m/min.

11. The method as claimed in claim 1, wherein the surface of copper foil layer produced in step (b) that is not adhered to said conductive carrier is subjected to electroplating using an acidic copper electroplating solution containing a chelating agent to form a profile layer having a surface roughness of at most about 7 $\mu$m.

12. The method as claimed in claim 11, wherein said profile layer surface has a surface roughness of about 1 to 5 $\mu$m, and a variation in surface roughness of about ±0.5 $\mu$m of the average surface roughness.

13. The method as claimed in claim 11, wherein said acidic electroplating solution further contains a least one compound selected from the group consisting of a zinc compound, a tin compound and a cobalt compound.

14. The method as claimed in claim 13, wherein said acidic electroplating solution comprises about 110 to 130 g/l of copper sulfate pentahydrate; from about 55 to 65 g/l of sulfuric acid; from about 21 to 24 g/l of a nitrate ion; from about 200 to 1,000 ppm of at least one compound selected from the group consisting of a zinc compound, a tin compound and a cobalt compound; and from about 5 to 20 g/l of a chelating agent.

15. The method as claimed in claim 14, wherein said copper electroplating solution comprises from about 115 to 120 g/l of copper sulfate pentahydrate; form about 55 to 60 g/l of sulfuric acid; from about 21 to 24 g/l of a nitrate ion; from about 250 to 500 ppm of said zinc compound, tin compound or cobalt compound; and about 5 to 10 g/l of said chelating agent.

16. The method as claimed in claim 11, wherein said acidic electroplating solution is contacted with said surface of copper foil layer produced in step (b) in a turbulent flow at a flow rate of from about 0.3 to 0.7 m/sec.

17. The method as claimed in claim 16, wherein said acidic copper electroplating solution is contacted with said surface of copper foil layer produced in step (b) at a flow rate of from about 0.35 to 0.45 m/sec.

18. The method as claimed in claim 11, wherein said electroplating is performed at current density of from about 30 to 55 A/dm$^2$.

19. The method as claimed in claim 11, wherein said electroplating is at a temperature of from about 20° to 22° C.

* * * * *